(12) United States Patent
Laia et al.

(10) Patent No.: US 9,634,168 B2
(45) Date of Patent: Apr. 25, 2017

(54) ATTACHMENT STRUCTURES FOR BUILDING INTEGRABLE PHOTOVOLTAIC MODULES

(75) Inventors: Joseph Laia, Santa Clara, CA (US); Anil Vijayendran, San Jose, CA (US); Adam C. Sherman, Newark, CA (US)

(73) Assignee: Beijing Apollo Ding Rong Solar Technology Co., Ltd., Beijing (CN)

( * ) Notice: Subject to any disclaimer, the term of this patent is extended or adjusted under 35 U.S.C. 154(b) by 745 days.

(21) Appl. No.: 13/198,539

(22) Filed: Aug. 4, 2011

(65) Prior Publication Data

US 2013/0032198 A1    Feb. 7, 2013

(51) Int. Cl.
*H01L 31/042*    (2014.01)
*H01L 31/00*    (2006.01)
(Continued)

(52) U.S. Cl.
CPC .......... *H01L 31/05* (2013.01); *H01L 31/0201* (2013.01); *H01R 13/5219* (2013.01);
(Continued)

(58) Field of Classification Search
CPC . H01L 31/0482; H01L 31/05; H01L 31/0201; H01R 13/5219; H02S 20/25;
(Continued)

(56) References Cited

U.S. PATENT DOCUMENTS 5,476,553 A * 12/1995 Hanoka et al. ............... 136/251
6,121,542 A *  9/2000 Shiotsuka ....... H01L 31/022425
                                                    136/256

(Continued)

FOREIGN PATENT DOCUMENTS

JP    WO2010001905    *  7/2010 .................... 136/256

OTHER PUBLICATIONS

U.S. Application titled "Interlocking Lips on Building Integrable Photovoltaic Module Edges," U.S. Appl. No. 13/039,706, filed Mar. 3, 2011.

(Continued)

*Primary Examiner* — Tamir Ayad
*Assistant Examiner* — Uyen Tran
(74) *Attorney, Agent, or Firm* — Weaver Austin Villeneuve & Sampson LLP

(57) ABSTRACT

Provided are novel building integrable photovoltaic (BIP) modules having specially configured attachment structures for securing these modules to building structures and other BIP modules. In certain embodiments, a BIP module includes a base sheet supporting photovoltaic cells and having a rigid polymer portion and a flexible polymer portion. The flexible portion is designed to be penetrated with mechanical fasteners during installation. The flexible portion may include fastening pointers and/or through holes for identifying specific penetration locations. The rigid portion provides necessary structural rigidity and support to the module and more specifically to the photovoltaic cells. In certain other embodiments, a BIP module includes an adhesive bumper strip disposed along one edge of the module and configured for secure this module with respect to another module. During installation, the strip is positioned between a back sealing sheet of one module and a front sealing sheet of another module.

15 Claims, 10 Drawing Sheets

(51) Int. Cl.
*H01L 31/05* (2014.01)
*H01L 31/02* (2006.01)
*H01R 13/52* (2006.01)
*H02S 20/25* (2014.01)
*H02S 40/36* (2014.01)
*F24J 2/52* (2006.01)
*F24J 2/46* (2006.01)

(52) U.S. Cl.
CPC ............... *H02S 20/25* (2014.12); *H02S 40/36* (2014.12); *F24J 2/5228* (2013.01); *F24J 2002/4676* (2013.01); *Y02B 10/12* (2013.01); *Y02E 10/50* (2013.01); *Y10T 29/49826* (2015.01)

(58) Field of Classification Search
CPC ............... Y02E 30/36; Y10T 29/49826; F24J 2002/4676
USPC .................................. 136/243–265
See application file for complete search history.

(56) References Cited

U.S. PATENT DOCUMENTS

| | | | |
|---|---|---|---|
| 6,172,295 B1* | 1/2001 | Hattori et al. | 136/251 |
| 6,201,179 B1* | 3/2001 | Dalacu | 136/244 |
| 6,342,669 B1* | 1/2002 | Sakai et al. | 136/244 |
| 7,829,781 B2* | 11/2010 | Montello et al. | 136/244 |
| 8,631,613 B1 | 1/2014 | Sherman | |
| 2003/0010372 A1 | 1/2003 | Dinwoodie | |
| 2004/0000334 A1 | 1/2004 | Ressler | |
| 2004/0187909 A1 | 9/2004 | Sato et al. | |
| 2005/0224108 A1* | 10/2005 | Cheung | 136/251 |
| 2008/0053009 A1 | 3/2008 | Plaisted et al. | |
| 2008/0302030 A1* | 12/2008 | Stancel et al. | 52/173.3 |
| 2009/0019795 A1 | 1/2009 | Szacsvay et al. | |
| 2010/0151238 A1* | 6/2010 | Burmeister | C09J 7/0289 428/344 |
| 2011/0005152 A1 | 1/2011 | Plaisted et al. | |
| 2011/0100437 A1* | 5/2011 | Takahashi | 136/251 |
| 2011/0108088 A1* | 5/2011 | Young et al. | 136/245 |
| 2012/0198780 A1* | 8/2012 | Snowwhite | 52/173.3 |
| 2012/0210660 A1 | 8/2012 | Livsey et al. | |

OTHER PUBLICATIONS

U.S. Office Action mailed Oct. 12, 2012, issued in U.S. Appl. No. 13/039,706.

U.S. Final Office Action mailed May 24, 2013, issued in U.S. Appl. No. 13/039,706.

U.S. Notice of Allowance dated Sep. 17, 2013, issued in U.S. Appl. No. 13/039,706.

* cited by examiner

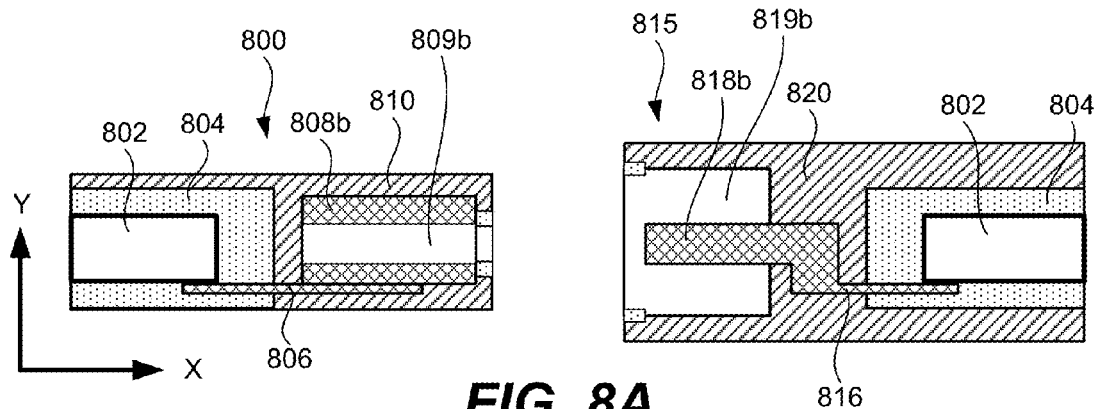
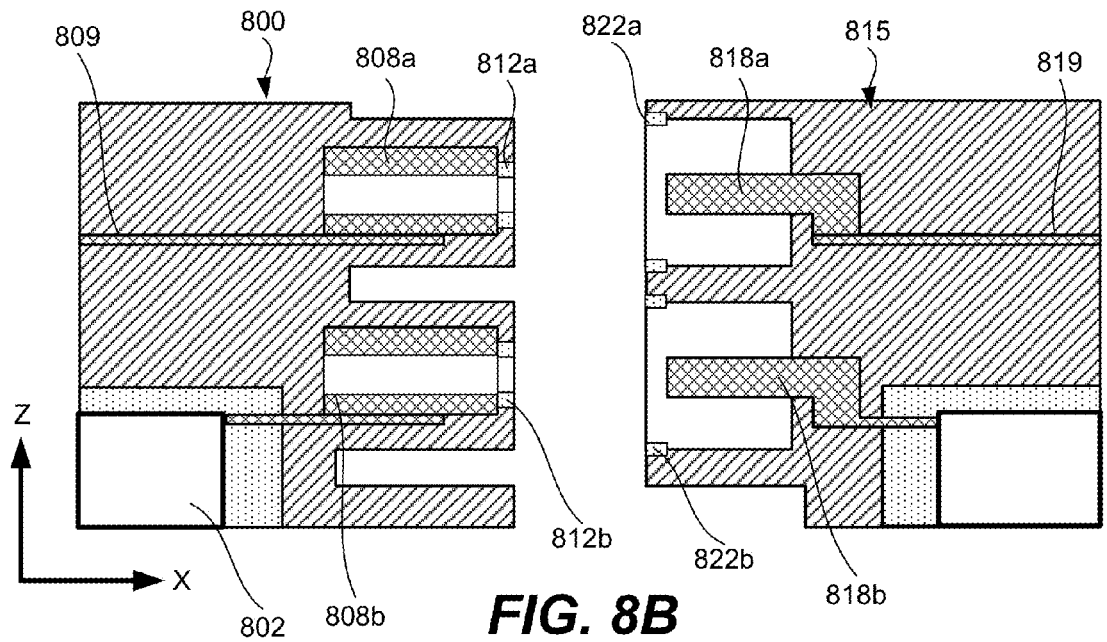
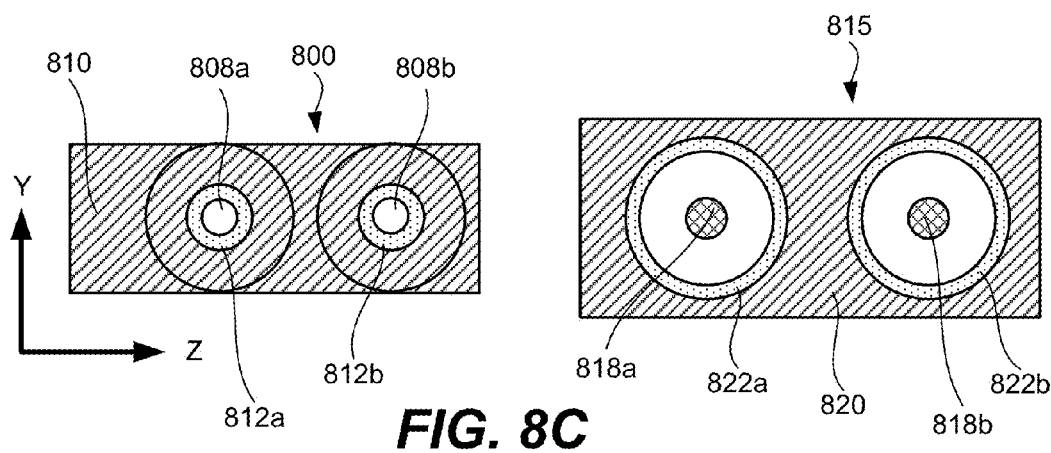
FIG. 8A
FIG. 8B
FIG. 8C

ATTACHMENT STRUCTURES FOR BUILDING INTEGRABLE PHOTOVOLTAIC MODULES

BACKGROUND

Photovoltaic cells are widely used for electricity generation with one or more photovoltaic cells typically sealed within in a module. Multiple modules may be arranged into photovoltaic arrays used to convert solar energy into electricity by the photovoltaic effect. Arrays can be installed on building rooftops and are used to provide electricity to the buildings and to the general electrical grid.

SUMMARY

Provided are novel building integrable photovoltaic (BIP) modules having specially configured attachment structures for securing these modules to building structures and other BIP modules. In certain embodiments, a BIP module includes a base sheet supporting photovoltaic cells and having a rigid polymer portion and a flexible polymer portion. The flexible portion is designed to be penetrated with mechanical fasteners during installation. The flexible portion may include fastening pointers and/or through holes for identifying specific penetration locations. The rigid portion provides necessary structural rigidity and support to the module and more specifically to the photovoltaic cells. In other embodiments, a BIP module includes an adhesive bumper strip disposed along one edge of the module and configured for securing one module with respect to another module. During installation, the strip may be positioned between a back sealing sheet of one module and a front sealing sheet of another module.

In certain embodiments, a BIP module includes a base sheet having a rigid polymer portion and a flexible polymer portion. The rigid polymer portion is used to support one or more photovoltaic cells attached to this portion. The flexible polymer portion is positioned in a support flap area of the module and configured to be penetrated by one or more mechanical fasteners during installation. Once the mechanical fasteners penetrate the flexible portion and protrude into the building structure, the module is mechanically supported with respect to a building structure. The flexible polymer portion may include one or more through holes extending between a front surface and a back surface of this portion. Alternatively or in addition to the through holes, the flexible polymer portion may include one or more fastening indicators on the front surface of this portion. In certain embodiments, the flexible portion allows the one or more mechanical fasteners, which have penetrated this portion, to move with respect to the rigid polymer portion and other parts of the module by at least about 5 millimeters. This range of movement may extend in any direction within a plane of the photovoltaic module. In certain embodiments, a flexible polymer portion is positioned closer to the photovoltaic cells than to the top edge of the moisture flap. In certain embodiments, a BIP module lodes a base sheet made from a semi-rigid polymer, such as polypropylene. This material may be ductile enough nailing (e.g., using a pneumatic nail gun) and may be rigid enough to support the rest of the module.

The flexible polymer portion may include one or more flexible materials. Some examples of flexible materials include polyethylene, polypropylene, thermoplastic olefins, thermoplastic rubber, thermoplastic elastomer, ethylene propylene diene, monomer (EPDM), fluoroelastomers or thermoplastic vulcanizates (TPV), and flexible cast thermoset materials, such as urethanes or silicones. In general, various flexible thermoplastic elastomers that have suitable thermally durable behavior may be used. Some specific examples include SANTOPRENE® (Supplied by Exxon Mobil in Houston, Tex.), HIPEX® (Supplied by Sivaco in Santa Clara, Calif.), EFLEX® (Supplied by E-Polymers Co., Ltd. in Seoul, Korea), ENFLEX® (Supplied by Enplast Limited in Longford, Ireland), EXCELINK® (Supplied by JSR Corporation in Tokyo, Japan), SYNOPRENE® (Supplied by Synoprene Polymers Pvt. Ltd. in Mumbai, India), and Elastron® (Supplied by Elastron Kimya in Kocaeli, Turkey). The rigid polymer portion may include one or more rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. Both rigid and flexible materials described above and elsewhere in this document may include engineered polymers, which are specifically formulated to meet certain requirements specific for photovoltaic applications. For example, certain hybrid block co-polymers may be used.

In certain embodiments, the flexible polymer portion occupies less than about 25% of the support flap area. The rigid polymer portion may support the flexible polymer portion along all edges of the flexible portion, i.e., the rigid portion effectively forms an enclosed frame around the flexible portion. The flexible polymer portion may be attached to the rigid polymer portion using one or more interlocking edges. In the same or other embodiments, the flexible polymer portion may be removable or separable from the rigid polymer portion, e.g., without compromising the sealing properties of the moisture flap. In other embodiments, a flexible polymer portion is permanently attached to a rigid polymer portion. The two portions may be over-molded by, for example, extending the flexible polymer portion over the rigid polymer portion. In certain embodiments, some bonding is achieved during over-molding by selecting rigid and soft polymer materials that have comparable melting temperatures, e.g., within about 25° C. or, more specifically, within about 10° C., or even within 5° C. For example, the same base resin may be used with a filler as a rigid polymer portion and without a filler as a flexible polymer portion.

Provided also are methods of installing a BIP module onto a building structure. One method involves providing the BIP module, similar to the ones described above, and providing one or more mechanical fasteners. The flexible polymer portion of the BIP module is penetrated with a fastener. A protruding portion of the fastener penetrates into the building structure to establish and provide mechanical support to the module with respect to the building structure.

In other embodiments, a BIP assembly includes two BIP modules with an adhesive bumper strip positioned in between the two modules. More specifically, the first (or top) module includes a first set of photovoltaic cells, a back sealing sheet, and a first edge. The second (or bottom) module includes a second set of photovoltaic cells, a front sealing sheet, and a second edge. The adhesive bumper strip is positioned in between the two modules along the first edge of the first module and the second edge of the second module. The adhesive bumper strip includes a body, a first adhesive surface contacting the back sealing sheet of the first module, and a second adhesive surface contacting the front sealing sheet of the second module. The adhesive bumper strip may be configured to provide a moisture tight seal between the two modules along their first and second edges, respectively. The adhesive bumper strip may also be configured to withstand a pull-out force of at least about 2 pounds per linear inch along the two edges.

In certain embodiments, the adhesive bumper strip separates the two modules by at least about 1 millimeter, or more specifically, by at least about 3 millimeters along the two edges. The adhesive bumper strip may extend outside of the back sealing sheet of the first module beyond its edge. The strip may also include a cavity for receiving at least two corners of the first edge of the first module. These features may be used for protection of the edge and/or corners of the first module during transportation and handling. In these embodiments, the strip is typically attached to the first module prior to installation of the module to the building structure.

In certain embodiments, one or both adhesive surfaces of the adhesive bumper strip include one or more flexible tabs configured to create variable gaps between two or more modules. The strip may be used with modules that have glass sealing sheets. Specifically, the back sealing sheet of the first photovoltaic module may include glass sheet. In the same or other embodiments, the front sealing sheet of the second photovoltaic module includes glass sealing sheet. The body of the strip may include one or more flexible polymer materials.

In certain embodiments, a BIP module includes a photovoltaic insert having a set of photovoltaic cells, a back sealing sheet, and an edge. The module also includes an adhesive bumper strip attached to the back sealing sheet along the edge. The adhesive bumper strip includes an adhesive surface for attaching to a surface of an adjacent BIP module.

These and other aspects of the invention are described further below with reference to the figures.

BRIEF DESCRIPTION OF THE DRAWINGS

FIGS. 8A-8C are schematic cross-sectional views of two connectors configured for interconnection with each other in accordance with certain embodiments.

DETAILED DESCRIPTION OF EXAMPLE EMBODIMENTS

Figure 1:
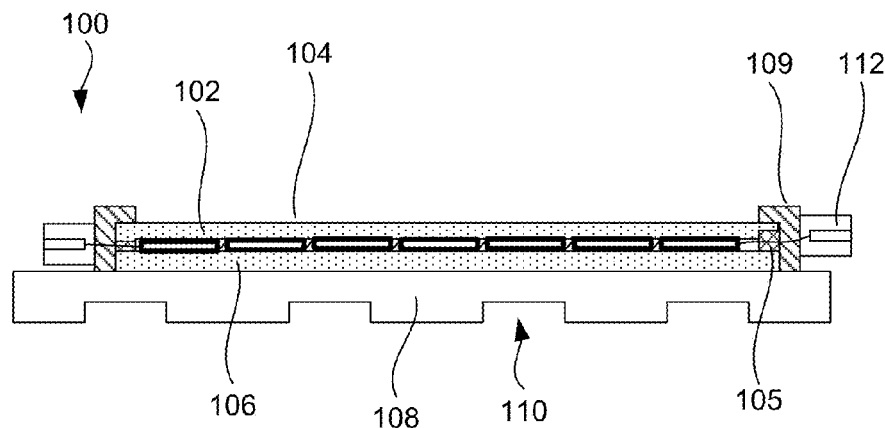
FIG. 1 is a schematic cross-sectional side view of a building integrable photovoltaic (BIP) module in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Building-integrable photovoltaic (BIP) modules are defined as specially configured photovoltaic modules that are used for integration into building structures in various parts of buildings, such as rooftops, skylights, or facades. In certain examples, BIP modules replace conventional building materials, such as asphalt shingles. Unlike traditional photovoltaic systems, BIP modules often do not require separate mounting hardware. As such, installed BIP modules provide substantial savings over more traditional systems in terms of building materials and labor costs. For example, a substantial part of traditional asphalt roof shingles may be replaced by "photovoltaic shingles." In certain embodiments, photovoltaic shingles are installed on the same base roof structures as the asphalt shingles. In fact, a rooftop may be covered by a combination of the asphalt and photovoltaic shingles. In certain embodiments, BIP modules are shaped like one or a collection of asphalt shingles. BIP modules may look and act much like the asphalt shingles while producing electricity in addition to protecting the underlying building structures from the environment. In certain embodiments, BIP modules may be about 14 (e.g., 13.25) inches by about 40 (e.g., 39.375) inches in size and may be stapled directly to the roof deck through water barrier roofing cloth, for example. Generally, only a portion of the photovoltaic shingle is exposed, while the remaining portion is covered by other shingles. The exposed portion is referred to as the "shingle exposure", while the covered portion is referred to as the "flap." For example, the shingle exposure of a 13.25 inch by 39.375 inch shingle may be only about 5 inches wide or, in some embodiments, about 5.625 inches wide. The length of the shingle exposure in some of these embodiments may be 36 inches or about 39.375 inches (if side skirts are not used, for example). Other dimensions of photovoltaic shingles may be used as well.

A photovoltaic shingle may be supported on a rooftop using a support flap, which may be nailed or otherwise mechanically fastened to the rooftop, e.g., roof boards. Generally, the support flap needs to have sufficient rigidity to provide adequate mechanical support to the photovoltaic shingle because the photovoltaic shingle is both much heavier and more brittle than conventional asphalt shingles. At the same time, many rigid polymer materials may be hard to penetrate during installation in the field and may require drilling or some other additional operations adding to installation costs.

To provide a better understanding of various features of BIP modules and methods of integrating connectors with photovoltaic inserts during module fabrication, some examples of BIP modules will now be briefly described. FIG. 1 is a schematic cross-sectional end view (line 1-1 in FIG. 2 indicates the position of this cross-section) of a BIP module 100 in accordance with certain embodiments. BIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include atom carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoroethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 g/m$^2$/day. In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sealing sheet 106. The attachment may be provided by a support edge 109, which, in certain embodiments, is a part of support sheet 108. Support sheets may be made, for example, from rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

BIP module 100 has one or more electrical connectors 112 for electrically connecting BIP module 100 to other BIP modules and array components, such as an inverter and/or a battery pack. In certain embodiments, BIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

Figure 2:
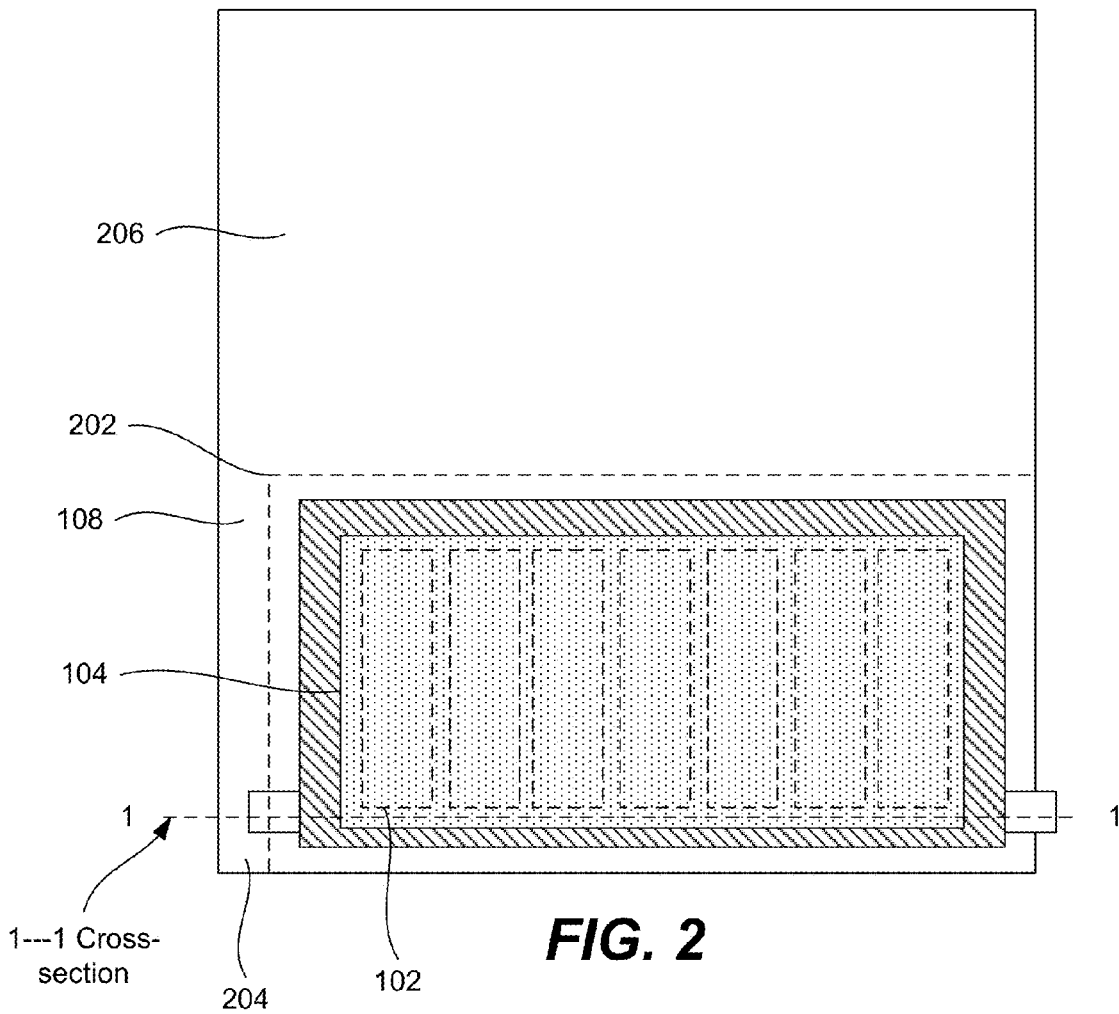
FIG. 2 is a schematic top view of a BIP module in accordance with certain embodiments.

FIG. 2 is a schematic top view of BIP module 100 in accordance with certain embodiments. Support sheet 108 is shown to have a side skirt 204 and a top flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of BIP module 100 that does not extend under other BIP modules or similar building materials (e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

Figure 3:
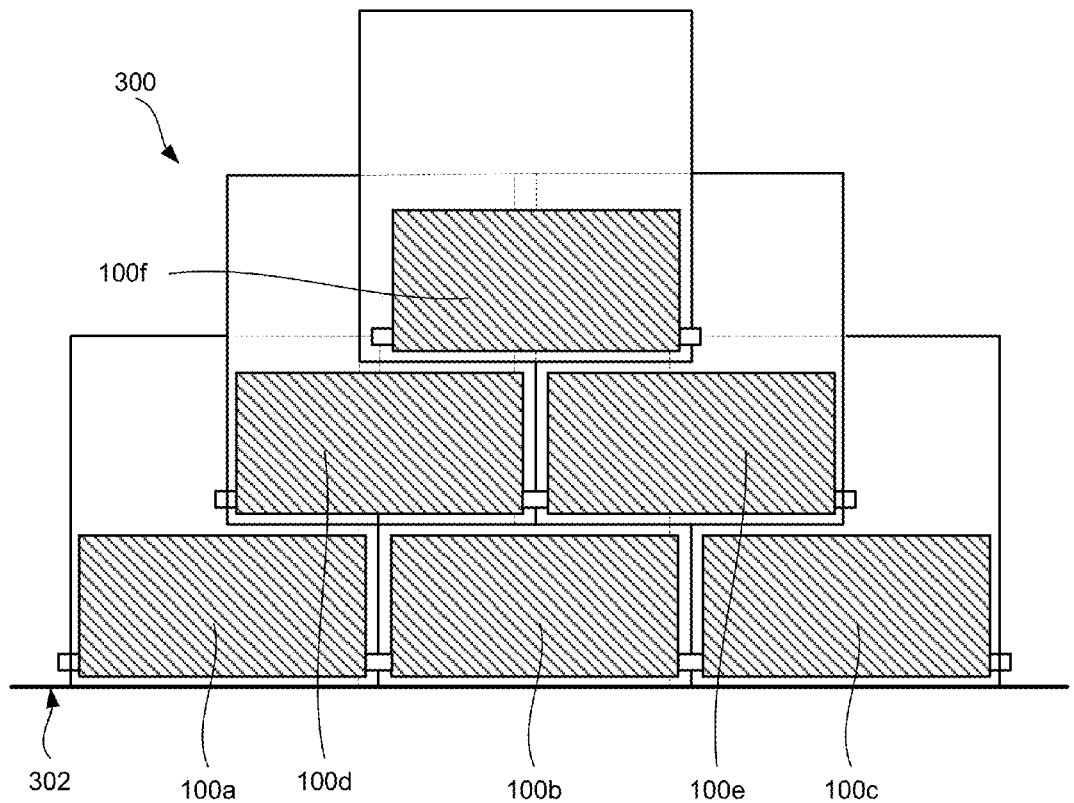
FIG. 3 illustrates a subset of a photovoltaic array that includes six BIP modules in accordance with certain embodiments.

FIG. 3 illustrates a photovoltaic array 300 or, more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another BIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
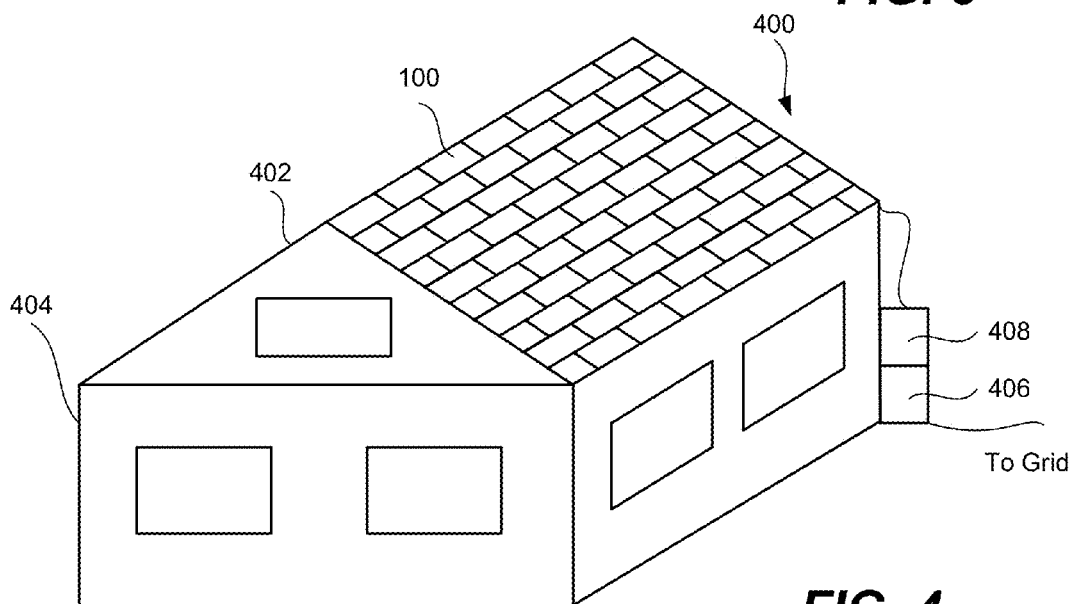
FIG. 4 is a schematic illustration of a photovoltaic array installed on a rooftop of a building structure in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple BIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIP modules 100 may also be used in combination with other roofing materials (e.g., asphalt shingles) and cover only a portion of rooftop. Generally, BIP modules 100 may be used on steep sloped to low slope rooftops. For example, the rooftops may have a slope of at least about 2.5-to-12 or, in many embodiments, at least about 3-to-12.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240-Gridtec 10, available from Trace Technologies in Livermore, Calif.) and a string inverter (e.g. Sunny Boy® 2500 available from SMA America in Grass Valley, Calif.). In certain embodiments, BIP modules may include integrated inverters, i.e., "on module" inverters. These inverters may be used in addition to or instead of external inverter 406. Battery pack 408 is used to balance electric power output and consumption.

Figure 5:
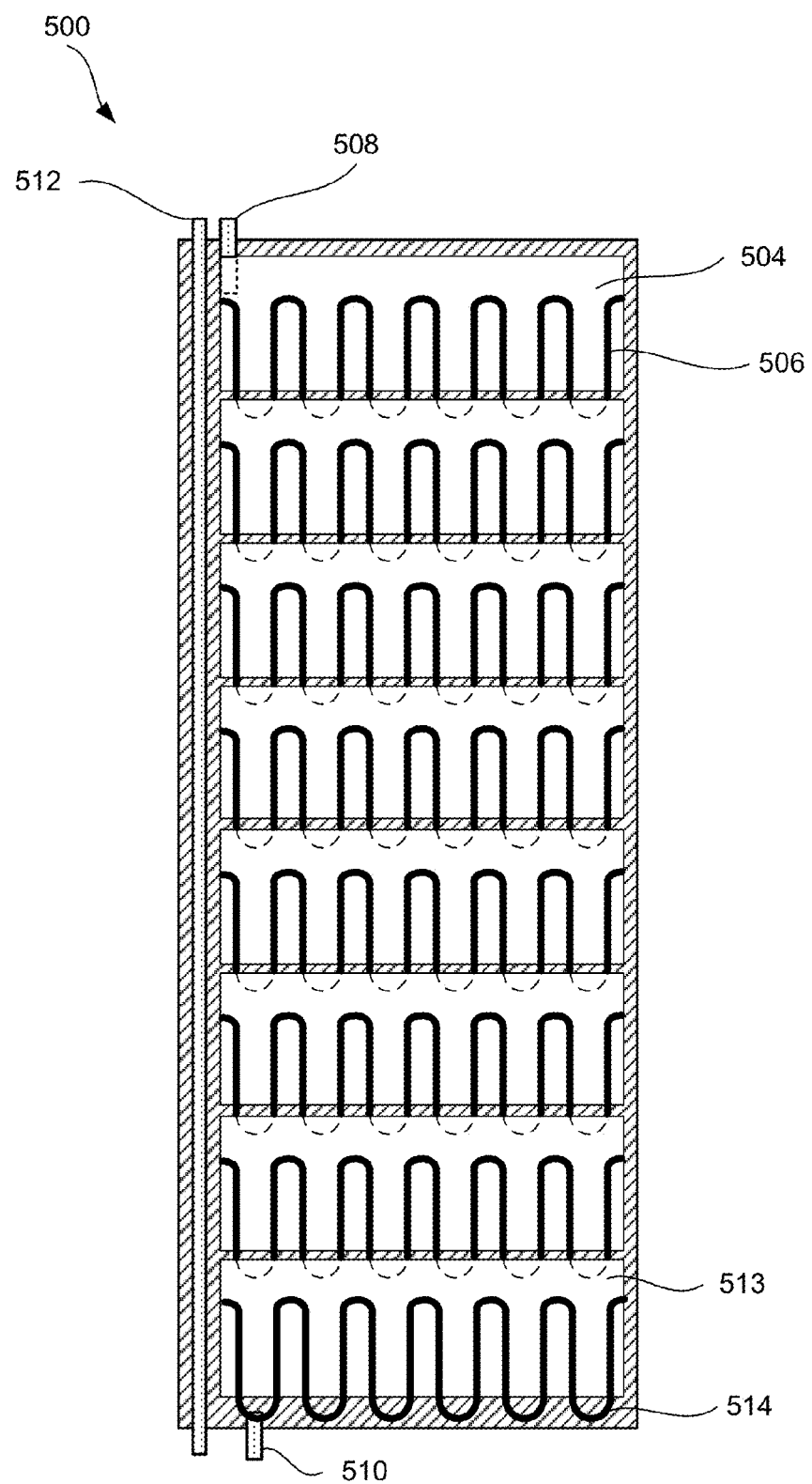
FIG. 5 is a schematic representation of a photovoltaic module having electrically interconnected photovoltaic cells in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
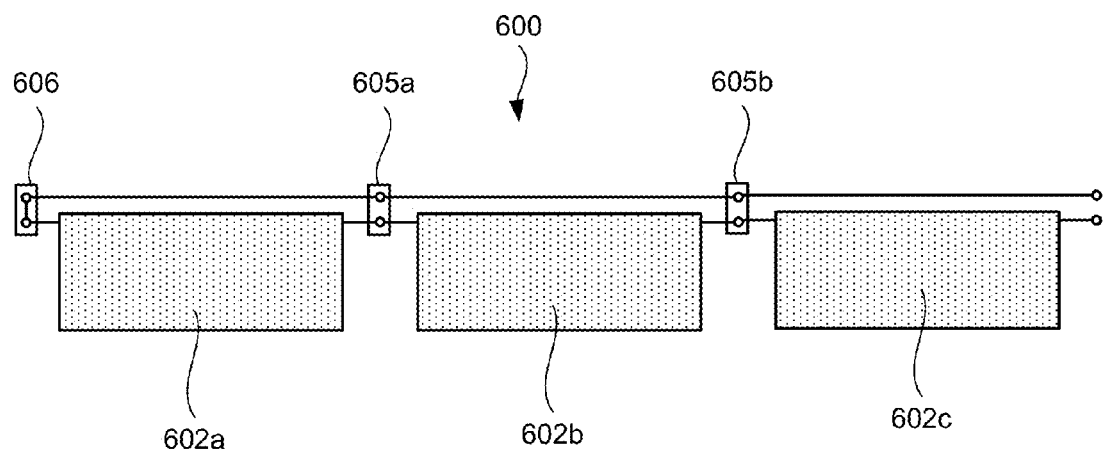
FIG. 6 is a schematic electrical diagram of a photovoltaic array having three BIP modules interconnected in series in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) may be used for connecting module connectors of two adjacent modules.

Module connector 606 may be a special separate connector component that is connected to one module only. It may be used to electrically interconnect two or more conductive elements of the same module connector.

Figure 7:
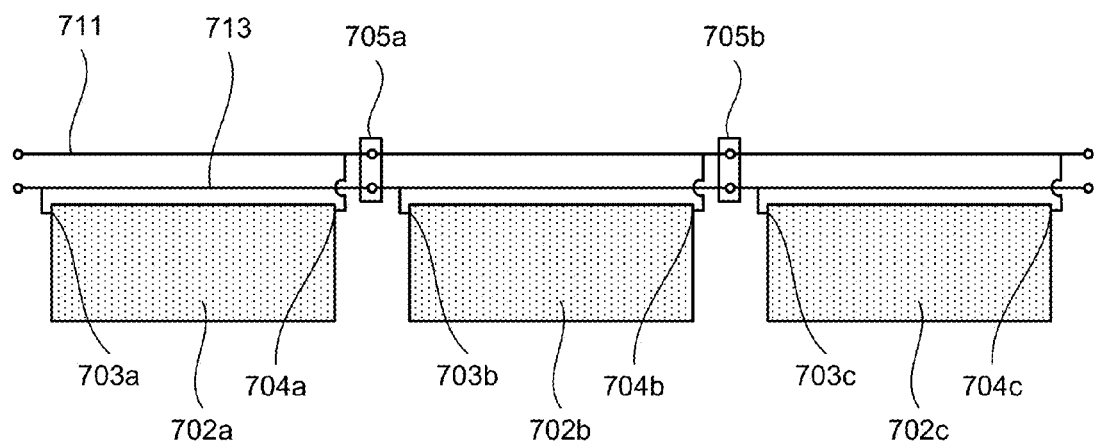
FIG. 7 is a schematic electrical diagram of another photovoltaic array having three BIP modules interconnected in parallel in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer can not accidently touch conductive elements or any other electrical elements of these connectors during handling of the BIP module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of sockets 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive element cavities 808a and 808b.

Figure 9:
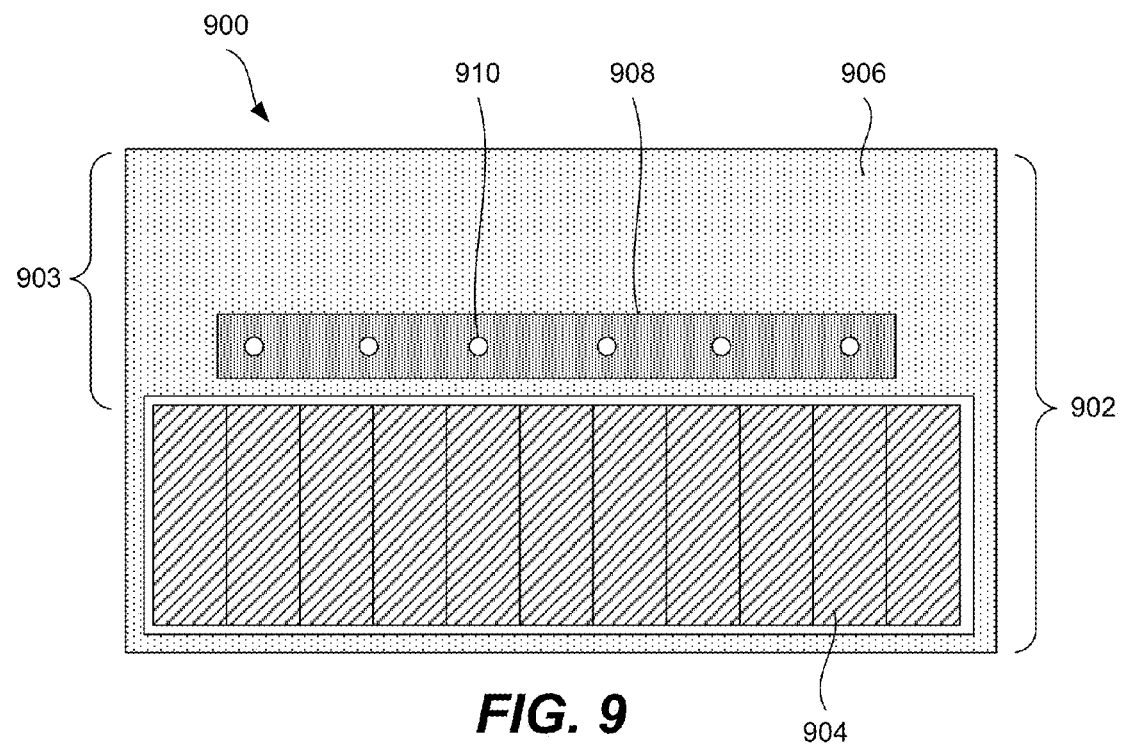
FIG. 9 is a schematic top view of a building integrable photovoltaic (BIP) module including a base sheet having a rigid polymer portion and a flexible polymer portion in accordance with certain embodiments.

Provided are novel BIP modules having specially configured attachment structures for attaching these modules to various building structures, such as rooftops, and other modules. The BIP modules include both rigid polymer portions and flexible polymer portions in the support flap area, which allows providing adequate rigidity and being easily penetrated with mechanical fasteners during installation without damage to the surrounding area. FIG. 9 is a schematic top view of a BIP module 900 that includes a base sheet 902 having a rigid polymer portion 906 and a flexible polymer portion 908 in accordance with certain embodiments. Flexible polymer portion 908 is positioned in a support flap area 903 of module 900. A portion of rigid polymer portion 906 also extends into support flap area 903. BIP module 900 also includes one or more photovoltaic cells 904 attached to the remaining portion of rigid polymer portion 906. Photovoltaic cells 904 may be copper indium gallium selenide (CIGS) cells or other types of photovoltaic cells. In a particular embodiment, module 900 includes at least ten CIGS cells electrically interconnected in series.

As explained above, rigid polymer portion 906 is needed to provide the overall structural rigidity to module 900, for example, to prevent breaking of the photovoltaic components and better mechanical support with respect to the building structure. Some examples of materials for a rigid polymer portion 906 are described above. As shown in FIG. 9, rigid polymer portion 906 may support flexible polymer portion 908 along all edges of flexible portion 908 and effectively form an enclosed frame around flexible portion 908. However, other embodiments are possible. For example, a rectangular flexible polymer portion may be supported along one of its edges, two of its edge, or three of its edges.

Support flap 903 area generally extends towards a rooftop and under another adjacent module to provide a moisture seal between the modules. It is often referred to as a moisture flap or as a top lap. Because support flap area 903 is covered and sealed, it generally used for attachment of the lower module (i.e., module 900 in FIG. 9) to a building structure. More specifically, support flap area 903 is typically penetrated by mechanical fasteners such as nails, screws, and staples without compromising moisture sealing or other characteristics of module 900. It has been proposed to use flexible polymer portion 908 for the part of support flap area 903, which is penetrated by the mechanical fasteners. In certain embodiments, flexible polymer portion 908 occupies only a smaller portion of support flap area 903, such as less than about 50%, less than about 25%, or even less than about 10%. This ratio of flexible polymer portion 908 to rigid polymer portion 906 in support flap area 903 may be needed to provide the overall structural rigidity of the module and its attachment with respect to the building structure. In certain embodiments, flexible polymer portion 908 includes multiple separate components each surrounded by rigid polymer portion 906. Each one of these separate portions may be located at specific fastening locations and provide indication where the fastening should occur. In certain embodiments, one or multiple polymer portions include specific nail indicators, such as colored patches.

Flexible polymer portion 908 may be made from one or more flexible materials listed above. The material type, thickness, and other characteristics may be selected in such a way that a nail or some other mechanical fastener may be driven through any part of flexible polymer portion 908 until the nail is sufficiently protruded into the building structure to ensure support. In certain embodiments, flexible polymer portion 908 may include one or more through holes 910 extending between the front and back surfaces of flexible polymer portion 908. Alternatively or in addition to the through holes, flexible polymer portion 908 may include one or more hole indicators on its front surface.

Module 900 may need to slightly move with respect to the supporting building structure after installation to accommodate for various factors including thermal expansion, shifts in the building structure, or minor misalignments. Flexibility of the materials used for flexible polymer portion 908 may allow for module 900 or, more specifically, for rigid polymer structure 906 to move with respect to the mechanical fasteners and the building structure. In certain embodiments, flexible polymer portion 908 allows rigid polymer structure 906 to move with respect to the mechanical fastener by at least about 1 millimeter or, more specifically, by at least about 1 millimeters or, even more specifically, by at least about 3 millimeters after installation of module 900. This motion may be in any direction within the plane established by the front surface of module 900.

Figure 10:
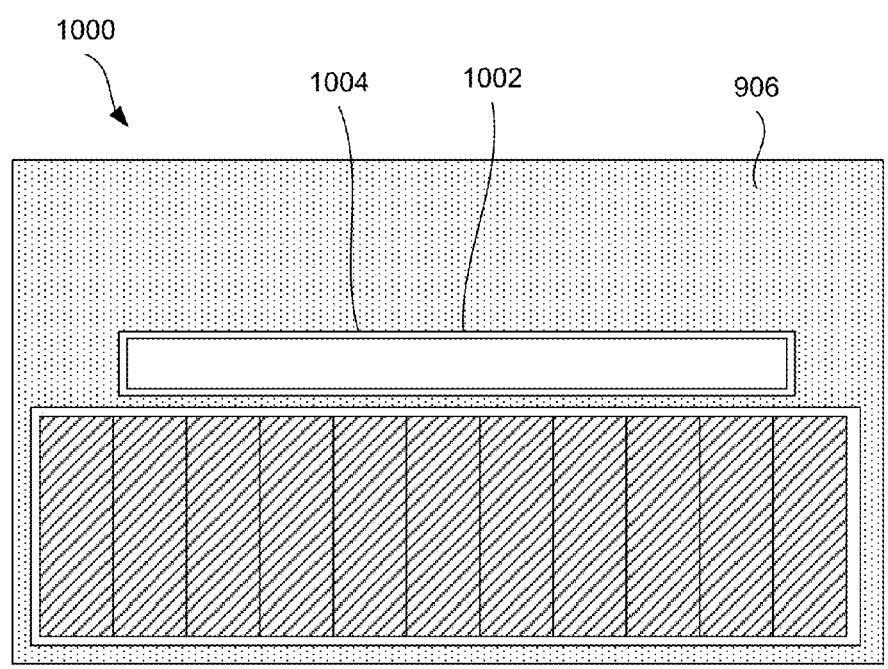
FIG. 10 is a schematic top view of the same BIP module with the flexible polymer portion removed in accordance with certain embodiments.

FIG. 10 is a schematic top view of BIP subassembly 1000 that does not have a flexible polymer portion in accordance with certain embodiments. IMP subassembly 1000 represents module 900 without its flexible polymer portion 908. In certain embodiments, a flexible polymer portion is removable from and/installable to subassembly 1000. Subassembly 1000 may be fabricated and supplied without the flexible polymer portion, which is installed into subassembly 1000 to form a complete module prior to its attachment onto the building structure. In these examples, different kinds of flexible polymer portions may be available to installers. A particular kind may be selected depending on particular installation requirements, e.g., slope of the roof, weight of the module, typical environmental conditions. In certain embodiments, a flexible polymer portion is attached to rigid polymer portion 906 using one or more interlocking edges 1004 that form an opening 1002. The flexible polymer portion is inserted into opening 1002 and interlocked with edges 1004 to form a module prior to installation on the building structure. Furthermore, as indicated above, a flexible polymer portion may be molded over the rigid polymer portion to provide seal and bond between the two portions.

Figure 11:
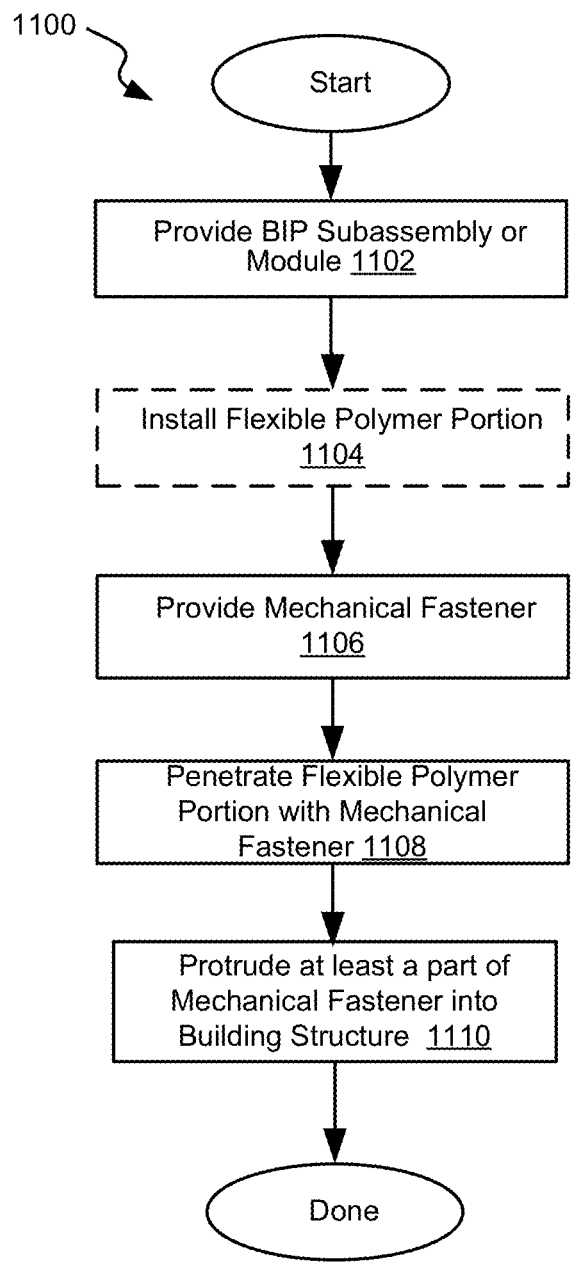
FIG. 11 is a process flowchart for installing a BIP module onto a building structure in accordance with certain embodiments.

Provided also are methods of installing a BIP module onto a building structure. FIG. 11 is a flowchart 1100 representing one examples of such a process. The process may start with providing the BIP module in operation 1102. Various examples of such modules are described above. Specifically, the provided module includes a base sheet having a rigid polymer portion and a flexible polymer portion. The module also includes one or more photovoltaic cells supported by the rigid polymer portion. The flexible polymer portion is positioned in the support flap area of the module and configured to be penetrated by one or more mechanical fasteners during installation. If the module does not have a flexible polymer portion already provided as a part of the module (i.e., the module is provided as a subassembly), then the process may involve an optional operation 1104 for installing an insert into the module. For example, an insert may interlock with specifically configured edges of the rigid polymer portion. In the same or other embodiments, the two portions may be bonded together by ultrasonic welding, laser welding, heat welding, or some other attachment techniques. The process also involves providing a mechanical fastener, such as a nail, screw, staple in operation 1106.

The process then continues with penetrating the flexible polymer portion with the mechanical fastener in operation 1108. In certain embodiments, this operation involves making a through hole through the flexible polymer portion. Specific locations of the through holes may be identified with fastener pointers, e.g., nail pointers. In other embodiments, the flexible polymer portion includes prefabricated through holes, and the mechanical fasteners are inserted through these through holes. The process then continues with protruding a portion of the fastener into the building structure to provide mechanical support to the module in operation 1110. This operation may be combined with operation 1108. For example, a nail or a staple may be driven through the flexible polymer portion and into the building structure in a single operation. The process may also involve dispensing adhesive and/or sealing materials in the areas between adjacent photovoltaic modules and/or between the building structure and photovoltaic modules. Other operations may involve establishing electrical connections between the modules.

Provided also is a BIP module containing an adhesive bumper strip attached to a sealing sheet of a module along one of its edges. The adhesive bumper strip helps to secure this edge to another module during installation and, in certain embodiments, to protect this edge prior to installation, e.g., during transportation, installation and handling.

After installation, the adhesive bumper strip is positioned between two modules and secures the back side of one module with respect to the front side of another module. Prior to installation, the adhesive bumper strip may be a part of one module (and attached to this module during fabrication of the module) or provided as a standalone component for use during installation. Various embodiments will be now described in more detail in the context of an installed assembly containing two modules.

Figure 12:
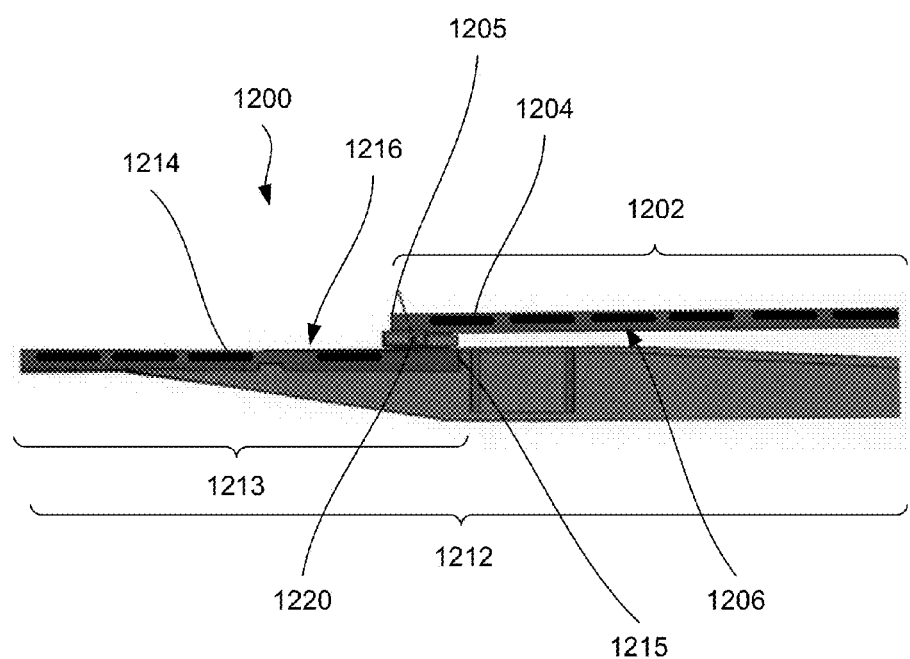
FIG. 12 is a schematic side view of a BIP assembly including two photovoltaic modules with an adhesive bumper strip positioned in between the modules in accordance to certain embodiments.

FIG. 12 is a schematic side view of a BIP assembly 1200 including a top module 1202, a bottom module 1212, and an adhesive bumper strip 1220 positioned in between the two modules in accordance with certain embodiments. Each module includes a set of photovoltaic cells. Specifically, top module 1202 includes photovoltaic cells 1204, and bottom module 1212 includes photovoltaic cells 1214. Photovoltaic cells 1204 and/or cells 1214 may be copper indium gallium selenide (CIGS) cells or other types of photovoltaic cells. In a particular embodiment, each module includes at least ten CIGS cells electrically interconnected in series.

Photovoltaic cells are protected within modules using one or more sealing sheets. The sealing sheets are used for environmental and electrical protection as well as mechanical support of cells and/or conductive elements positioned within the modules. Sealing sheets can be made from rigid and/or flexible materials. For example, in certain embodiments both front and back sheets are made from rigid glass sheets. In another example, a front sheet is made from a rigid glass sheet, while a back sheet is made from a flexible sheet. In yet another example, both sheets are flexible. Examples of rigid materials include window glass, plate glass, silicate glass, low iron glass, tempered glass, tempered CeO-free glass, float glass, colored glass, and the like. In certain embodiments, one or both of the front and back sheets are made from or include polymer materials. Examples of polymer materials, which can be rigid or flexible, include poly(ethylene terephthalate), polycarbonate, polypropylene, polyethylene, polypropylene, cyclic polyolefins, norbornene polymers, polystyrene, syndiotactic polystyrene, styrene-acrylate copolymers, acrylonitrile-styrene copolymers, poly (ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymer, and the like. A thickness of the sealing sheet may be between about 0.1 millimeters and about 15 millimeters or, more particularly, between about 2.5 millimeters and about 10 millimeters, for example, about 3 millimeters or about 4 millimeters.

Two sealing sheets of the module form the back side and the front side used for attachment to other modules using adhesive bumper strips. Specifically, top module 1202 has a back side 1206 attached to adhesive bumper strip 1220, while bottom module 1212 has a front side 1216 attached to adhesive bumper strip 1220. Adhesive bumper strip 1220 is generally positioned along edges of the photovoltaic portions of the module, e.g., edges 1205 and 1215. Some of these edges, such as edge 1205 also represent an edge of module 1202. Adhesive bumper strip 1220 may be a single integrated component extending along the entire edge or may be multiple separate components positioned along the edge. For example, adhesive bumper strip 1220 may have two separate pieces positioned near the corners of the edge. Separate components may be used when, for example, an under side of the top module needs to be ventilated. A moisture seal between two modules may be provided by adhesive bumper strip 1220 (when it is a single component extending along the edge) or some other components.

Adhesive bumper strip 1220 may be used to attach to sealing sheets that are glass sheets or sealing sheets that are made from any other materials listed above. Depending on sealing sheet materials, their surface conditions (e.g., roughness), and other properties, adhesive bumper strip 1220 may be configured differently. For example, when attaching to a glass sealing sheet or other rigid sealing sheet, a body of adhesive bumper strip 1220 may be made from a softer compressible material then, for example, when adhesive bumper strip 1220 is used in combination with flexible sealing sheets. Furthermore, sealing sheet surfaces may be specially configured to provide better adhesion to adhesive bumper strip 1220.

Figure 13A:
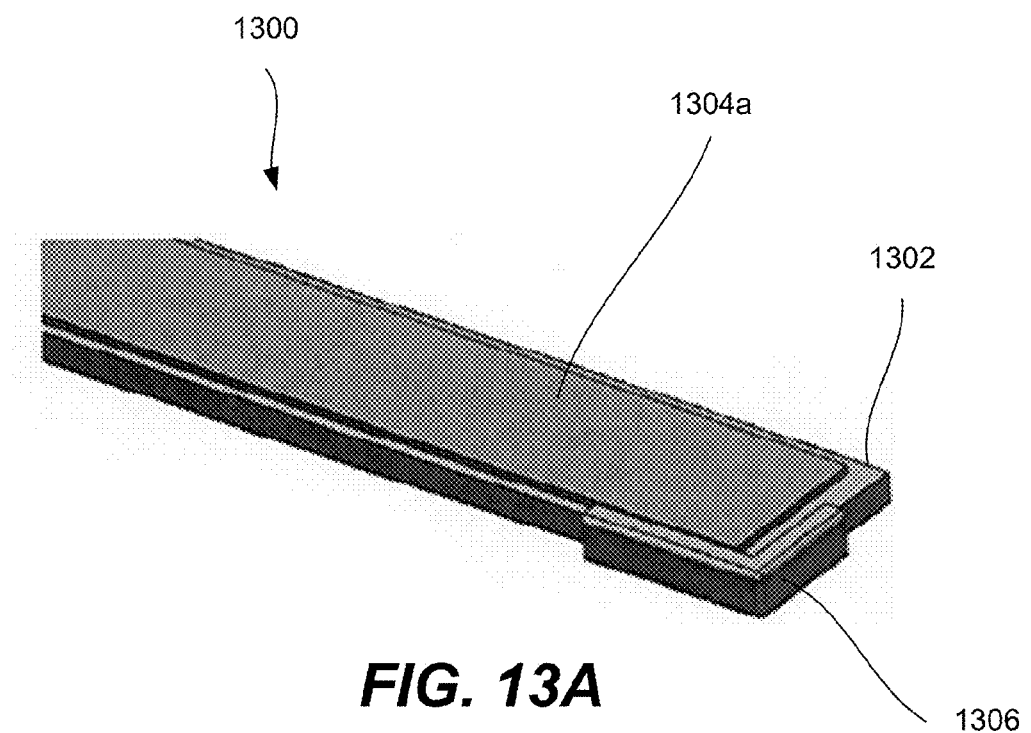
FIGS. 13A and 13B are schematic perspective and side cross-sectional views of the adhesive bumper strip in accordance with certain embodiments.
Figure 13B:
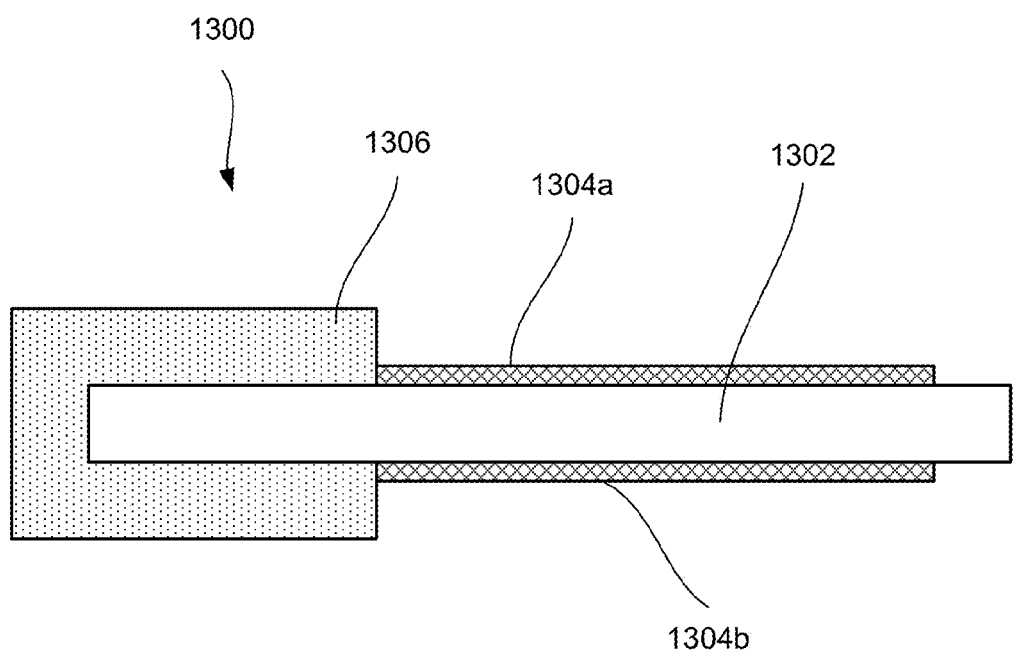

FIGS. 13A and 13B are schematic perspective and side cross-sectional views of an adhesive bumper strip 1300 in accordance with certain embodiments. Adhesive bumper strip 1300 includes a body 1302 and two adhesive surfaces 1304*a* and 1304*h*. Body 1302 may be made from various polymer materials, such as poly(ethylene terephthalate), polycarbonate, polypropylene, polyethylene, polypropylene, cyclic polyolefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymer, and the like. In certain embodiments, body 1302 is made from a compressible material that allows adhesive surfaces 1304*a* and 1304*b* or, more specifically, the sealing sheets of the two modules attached to these surfaces after installation to move with respect to each other. Each of adhesive surfaces 1304*a* and 1304*b* is configured to attach to a different BIP module or more specifically to sealing sheets of the modules. Various examples of sealing sheet materials are described above. Examples of adhesive materials include polychloroprene, butyl rubber, nitrile rubber, bituminous asphalt based materials (including various modified bituminous asphalt based materials), vinyl materials, vinyl acrylics, silicones, ethylene propylene diene monomer (EPDM), chlorosulfonated polyethylene (CSPE), PSA type materials (e.g., derived from a film-forming elastomeric material such as natural rubber, styrene-butadiene, butyl, silicone, nitrile, and acrylic rubber). An adhesive material may be provided as a single continuous strip or as a series of patches. In certain embodiments (not shown), an adhesive bumper strip is integrated into one of the modules and has only one adhesive surface. A body of the strip may be a part of the module frame or sealing sheet. Furthermore, a bumper strip may have interlocking features disposed along one or two (opposite) sides for interlocking with one or both modules. The interlocking features may be used in addition to or instead of the adhesive surfaces.

In certain embodiments, adhesive bumper strip 1300 is configured to provide a moisture tight seal between two modules to which it is attached. As described above, adhesive bumper strip 1300 may extend over the entire length of the modules' edges and seal any gap in between the modules. More specifically, adhesive bumper strip 1300 may have a compressible body (e.g., made from a rubber-like material or polyurethane foam) that provides sufficient sealing properties. In these embodiments, moisture does not penetrate in between the two modules along their respective edges, which may be particularly useful for low pitched roofs. Furthermore, without being restricted to any particular theory, it is believed that substantially closing the gap between the two modules helps to minimize the risk of lifting up the top module during, for example, gusty winds.

Adhesive bumper strip 1300 may also be configured to withstand high pull-out forces exerted in between the modules. The pull-out forces may be caused by winds and/or other environmental factors. For example, adhesive bumper strip 1300 may also be configured to withstand a pull-out force of at least about 1 pound per linear inch along its length or, more specifically, at least about 2 pounds per linear inch or, even more specifically, at least about 4 pounds per linear inch. It is believed that a pull-out force of about 2.2 pounds per linear inch corresponds to a 160-mph wind blowing into a 3-mm wide channel. In the same or other embodiments, adhesive bumper strip 1300 is configured to separate two modules by at least about 1 millimeter along their edges or, more specifically, by at least about 3 millimeters or, even more specifically, by at least about 5 millimeters along their edges. While smaller gaps may be desirable from the mechanical integrity and attachment perspectives, a substantial separation or gap may be needed to establish ventilation underneath the top module and/or to provide drain channels.

In certain embodiments, a portion of adhesive bumper strip 1300 extends outside of the sealing sheets of one of both modules. Adhesive bumper strip 1300 may include a corner protrusion 1306 extending away from body 1302 that forms raised edges covering one or both corners or, in more specific embodiments, a complete edge of at least one module. As described above, adhesive bumper strip 1300 may be positioned on one module during its fabrication and used for protecting the edge and/or corners of that module during transportation and handling. Corner protrusion 1306 of adhesive bumper strip 1300 may also be used to align adhesive bumper strip 1300 with respect to the module during installation. In certain embodiments, corner protrusion 1306 forms raised edges on both sides of body 1302 that are used to align both sets of edges or corners of the two modules. This feature may be also used for referencing one module with respect to another one.

In certain embodiments, a variable gap may be formed in between top and bottom modules. For example, two rows of modules in the array may be offset such that the bottom module has two top modules extending over its support flap. One top module may be positioned at a slightly different distance from the bottom module than the other top module, i.e., the gap between one pair of the modules is different than between the other pair of the modules. At the same time, the three modules may need to be secured together by the same adhesive bumper strip. Furthermore, one module may be aligned differently than another module such that two planes formed by the back side of the top module and the front side of the bottom module are not parallel. This misalignment will result in different gaps formed in between two modules. In accordance with one embodiment of the present invention, this may be accomplished by an adhesive bumper strip that has compressible body (e.g., a body made of foam or other compressible materials). In certain embodiments, the body of the adhesive bumper strip is compressible by more than 25% of its initial thickness or, more specifically, by more than 50%. In another embodiment, an adhesive bumper strip has flexible tabs extending from the body for making contact with the modules. Different tabs may extend at different distances (i.e., flex at different angles) effectively forming different gaps in between two or more modules.

Tabs may be positioned on one or both sides of the body. Furthermore, similar adhesive bumper strips (e.g., having flexible tabs and/or compressive bodies) may be used for attaching to uneven front surfaces of the photovoltaic modules. For example, a module may have a photovoltaic insert that is positioned lower than the frame supporting this insert. In other words, the frame may extend above the front sealing sheet of the insert. An adhesive bumper strip positioned over this module may still establish contact with the front sealing sheet as well as with the frame. Overall, adhesive bumper strips may be designed to compensate variations between modules and within modules.

Figure 14:
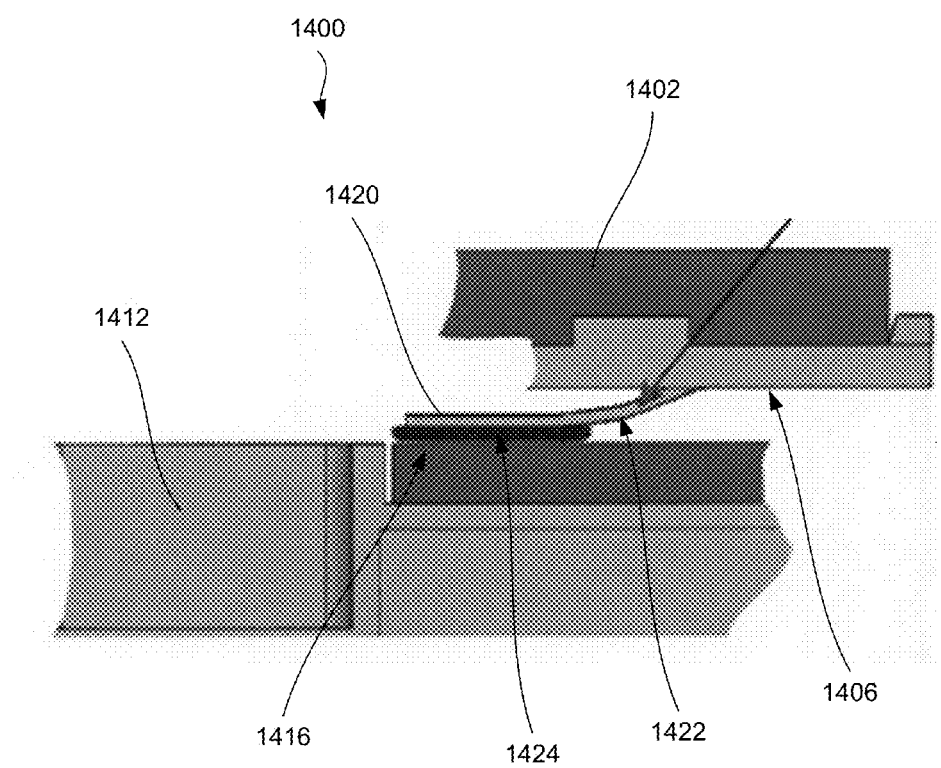
FIG. 14 is a schematic side view of an adhesive bumper strip including flexible tabs in accordance with certain embodiment

FIG. 14 is a schematic side view of one example of an assembly portion 1400 including an adhesive bumper strip 1420 with a flexible tab 1422 in accordance with certain embodiments. Flexible tab 1422 is configured to create variable gap between back side 1406 of top module 1402 and front side 1416 of bottom module 1412. When multiple tabs are used along the length of modules 1402 and 1412, different tabs may flex differently accommodating any misalignments or other variability that may exists in between the two modules. Flexible tab 1422 is shown to have an adhesive portion 1424 that is used to form a contact with front side 1416 of module 1412.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building integrable photovoltaic assembly comprising:
   a first photovoltaic module comprising a first set of photovoltaic cells, a back sealing sheet, a first edge, and a first corner, wherein the first edge and another edge of the first photovoltaic module intersect at the first corner;
   a second photovoltaic module comprising a second set of photovoltaic cells, a front sealing sheet, and a second edge;
   an adhesive bumper strip positioned in between the first photovoltaic module and the second photovoltaic module along the first edge of the first module and the second edge of the second module securing the first photovoltaic module with respect to the second photovoltaic module, the adhesive bumper strip comprising:
      a body comprising a first surface and a second surface;
      a first adhesive on the first surface of the body and in contact with the back sealing sheet of the first photovoltaic module;
      a second adhesive on the second surface of the body and in contact with the front sealing sheet of the second photovoltaic module; and
      a corner protrusion comprising a first part and a second part that intersect to form a corner of the corner protrusion, wherein:
         the corner protrusion extends away from the body in a direction away from the first surface,
         the body and the corner protrusion are different materials than the first and second adhesives,
         the adhesives of the adhesive bumper strip are located only on the first surface and second surface of the body, and
         the corner protrusion extends around at least part of the first corner of the first photovoltaic module when the adhesive bumper strip is positioned in between the first photovoltaic module and the second photovoltaic module along the first edge of the first module.

2. The building integrable photovoltaic assembly of claim 1, wherein the adhesive bumper strip is configured to provide a moisture tight seal between the first photovoltaic module and the second photovoltaic module along the first edge of the first module and the second edge of the second module.

3. The building integrable photovoltaic assembly of claim 1, wherein the adhesive bumper strip is configured to withstand a pull-out force of at least about 2 pounds per linear inch along the first edge of the first module and the second edge of the second module.

4. The building integrable photovoltaic assembly of claim 1, wherein the adhesive bumper strip separates the first module and the second module by at least about 3 millimeter along the first edge of the first module and the second edge of the second module.

5. The building integrable photovoltaic assembly of claim 1, wherein:
   the first photovoltaic module further comprises a second corner, wherein the first edge and a third edge of the first photovoltaic module intersect at the second corner,
   the body further comprises a second corner protrusion that includes a third part and a fourth part that intersect to form a corner of the second corner protrusion,
   the second corner protrusion extends away from the body in a direction away from the first surface,
   the second corner protrusion is a different material than the first and second adhesives, and
   the second corner protrusion extends around at least part of the second corner of the first photovoltaic module when the adhesive bumper strip is positioned in between the first photovoltaic module and the second photovoltaic module along the first edge of the first module.

6. The building integrable photovoltaic assembly of claim 1, wherein the second adhesive is on a plurality of flexible tabs that extend away from the body, wherein the distance between portions of the second adhesive and the first adhesive varies.

7. The building integrable photovoltaic assembly of claim 1, wherein the back sealing sheet of the first photovoltaic module comprises a glass sheet.

8. The building integrable photovoltaic assembly of claim 1, wherein the front sealing sheet of the second photovoltaic module comprises a glass sealing sheet.

9. The building integrable photovoltaic assembly of claim 1, wherein the body comprises one or more flexible polymer materials.

10. A building integrable photovoltaic module comprising:
   a photovoltaic insert comprising a set of photovoltaic cells, a back sealing sheet, an edge, and a first corner, wherein the edge and another edge of the first photovoltaic insert intersect to form the first corner; and
   an adhesive bumper strip attached to the back sealing sheet along the edge, the adhesive bumper strip comprising:
      a body comprising a first surface, an adhesive on the first surface of the body for attaching to a front surface of an adjacent building integrable photovoltaic module, a corner protrusion comprising a first part and a second part that intersect to form a corner of the corner protrusion, wherein:

the corner protrusion extends away from the body in a direction opposite the first surface, the body and the corner protrusion are different materials than the adhesive, the adhesives of the adhesive bumper strip are located only on the first surface and second surface of the body, and the corner protrusion extends around at least part of the first corner of the first photovoltaic insert when the adhesive bumper strip is attached to the back sealing sheet along the edge.

11. The building integrable photovoltaic assembly of claim 1, wherein the body is compressible by at least 25% of an initial thickness.

12. The building integrable photovoltaic assembly of claim 1, wherein the body is compressible by at least 50% of an initial thickness.

13. The building integrable photovoltaic assembly of claim 1, wherein the body is one of poly(ethylene terephthalate), polycarbonate, polypropylene, polyethylene, polypropylene, a cyclic polyolefin, a norbornene polymer, polystyrene, polystyrene, a styrene-acrylate copolymer, an acrylonitrile-styrene copolymers, poly(ethylene naphthalate), polyethersulfone, polysulfone, a nylon, poly(urethanes), an acrylics, a cellulose acetate, a cellulose triacetate, cellophane, a vinyl chloride polymer, polyvinylidene chloride, a vinylidene chloride copolymer, a fluoropolymer, a polyvinyl fluoride, polyvinylidene fluoride, polytetrafluoroethylene, or an ethylene-tetrafluoroethylene copolymer.

14. The building integrable photovoltaic assembly of claim 10, wherein the body is compressible by at least 25% of an initial thickness.

15. The building integrable photovoltaic assembly of claim 10, wherein the body is compressible by at least 50% of an initial thickness.

* * * * *